(12) United States Patent
Paltiel et al.

(10) Patent No.: US 11,437,501 B2
(45) Date of Patent: Sep. 6, 2022

(54) DEVICE FOR ELECTRIC FIELD INDUCED LOCAL MAGNETIZATION

(71) Applicants: YEDA RESEARCH AND DEVELOPMENT CO. LTD., Rehovot (IL); YISSUM RESEARCH DEVELOPMENT COMPANY OF THE HEBREW UNIVERSITY OF JERUSALEM LTD., Jerusalem (IL)

(72) Inventors: Yossef Paltiel, Maskeret Batya (IL); Ron Naaman, Yarkona (IL); Karen Michaeli, Rehovot (IL); Eilam Smolinsky, Rehovot (IL)

(73) Assignees: Yeda Research and Development Co. Ltd., Rehovot (IL); Yissum Research Development Company of the Hebrew University of Jerusalem Ltd., Jerusalem (IL)

( * ) Notice: Subject to any disclaimer, the term of this patent is extended or adjusted under 35 U.S.C. 154(b) by 0 days.

(21) Appl. No.: 17/045,892

(22) PCT Filed: Apr. 7, 2019

(86) PCT No.: PCT/IL2019/050392
§ 371 (c)(1),
(2) Date: Oct. 7, 2020

(87) PCT Pub. No.: WO2019/198069
PCT Pub. Date: Oct. 17, 2019

(65) Prior Publication Data
US 2021/0143268 A1 May 13, 2021

Related U.S. Application Data

(60) Provisional application No. 62/654,683, filed on Apr. 9, 2018.

(51) Int. Cl.
*G11C 16/04* (2006.01)
*H01L 29/66* (2006.01)
(Continued)

(52) U.S. Cl.
CPC ... *H01L 29/66984* (2013.01); *G01N 27/4145* (2013.01); *G11C 11/02* (2013.01);
(Continued)

(58) Field of Classification Search
CPC ............. H01L 29/66984; H01L 29/205; H01L 29/778; H01L 43/065; H01L 29/2003; G11C 11/02
See application file for complete search history.

(56) References Cited

U.S. PATENT DOCUMENTS 5,657,389 A * 8/1997 Houvener ............ G06Q 20/341
713/186
9,818,692 B2 * 11/2017 Roberts ................. H01L 29/402
(Continued)

FOREIGN PATENT DOCUMENTS

| CN | 104101626 A | 10/2014 |
|---|---|---|
| EP | 2 190 022 A1 | 5/2010 |
| WO | 2013/112541 A2 | 8/2013 |

OTHER PUBLICATIONS

Awschalom, et al., Spintronics without magnetism, Physics, 2009, pp. 1-5, vol. 50.
(Continued)

*Primary Examiner* — Pho M Luu
(74) *Attorney, Agent, or Firm* — Browdy and Neimark, P.L.L.C.

(57) ABSTRACT

In a technique for inducing local electric field controlled magnetization, despite the absence of magnetic components, there is provided a novel heterostructure, a semiconductor device thereof, or an array of semiconductor devices. The
(Continued)

heterostructure includes a semiconductor substrate carrying a plurality of layers forming at least one heterojunction and hosting a two-dimensional electron gas layer when one of the layer of the plurality of layers is bounded to an interacting layer being a chiral or a biological macromolecule assembly.

19 Claims, 8 Drawing Sheets

(51) Int. Cl.
    *G01N 27/414*     (2006.01)
    *G11C 11/02*     (2006.01)
    *H01L 29/205*     (2006.01)
    *H01L 29/778*     (2006.01)
    *H01L 43/06*     (2006.01)
    *H01L 29/20*     (2006.01)

(52) U.S. Cl.
    CPC ...... *H01L 29/205* (2013.01); *H01L 29/66462* (2013.01); *H01L 29/778* (2013.01); *H01L 43/065* (2013.01); *H01L 29/2003* (2013.01)

(56) References Cited

U.S. PATENT DOCUMENTS

2009/0195939 A1*   8/2009   Gurney .................. G11B 5/374
                                                                                                                     360/314
2011/0037512 A1     2/2011   Finkelstein et al.

OTHER PUBLICATIONS

Ben Dor, et al., A chiral-based magnetic memory device without a permanent magnet, Nature Communications, 2013, pp. 1-6, 4:2256.
Ben Dor, et al., Local Light-induced Magnetization Using Nanodots and Chiral Moelcues, Nano Letters, 2014, pp. 1-8.
Ben Dor, et al., Magnetization switching in ferromagnets by adsorbed chiral molecules without current or external magnetic field, Nature Communications, 2017, pp. 1-7, 8:14567.
Dietl, Tomasz, A ten-year perspective on dilute magnetic semiconductors and oxides, Nature Materials, Dec. 2010, pp. 965-974, vol. 9.
Espinosa, et al., Detection of different target-DNA concentrations with highly sensitive AlGaN/GaN high electron mobility transistors, Sensors and Actuators, 2015, pp. 633-639, B 210.
Heron, et al., Electric-Field-Induced Magnetizatoin Reversal in a Ferromagnet-Multiferroic Heterostructure, Physical Review Letters, Nov. 18, 2011, pp. 217202-1-217202-5, 107.
Kejriwal, et al., A novel back gated GaN/AlGaN HEMT structure for biological sensing applications, IEE 2nd International Conference on Emerging Electronics (ICEE), 2014, pp. 1-4.
Kent, et al., A new spin on magnetic memories, Nature Nanotechnology, Mar. 2015, pp. 187-191, vol. 10.
Kettner, et al., Spin Filtering in Electron Transport Through Chiral Oligopeptides, The Jouranl of Physical Chemistry, 2015, pp. 14542-14547, 119.
Kettner, et al., A Silicon-Based Room Temperature Spin Source without Magnetic Layers, Advanced Materials Interfaces, 2016, pp. 1-6, 3.
Koplovitz, et al., Magnetic Nanoplatelet-Based Spin Memory Device Operating at Ambient Temperatures, Advanced Materials, 2017, pp. 1-6, 1606748.
Matsukura, et al., Control of magnetism by electric fields, Nature Nanotechnology, Mar. 2015, pp. 209-220, vol. 10.
Mathew, et al., Non-Magnetic organic/inorganic spin injector at room temperature, Applied Physics Letters, 2014, pp. 242408-1-242408-4, 105.
Michaeli, et al., A new approach towards spintronics-spintronics with no magnets, J. Phys.: Condens. matter, 2017, pp. 1-8, 29.
Naaman, et al., Spintronics and Chirality: Spin Selectivity in Electron Transport Through Chiral Molecules, Annu. Rev. Phys. Chem., 2015, pp. 263-281, 66.
Ralph, et al., Spin Transfer Torques, 2008, pp. 1-27.
Rosenberg, Chiral Selective Chemistry Induced by Natural Selection of Spin-Polarized Electrons, Angew. Chem. Int. Ed., 2015, pp. 7295-7298, 54.
Smolinsky, et al., Electric Field-Controlled Magnetization in GaAs/AlGaAs Heterostructures—Chiral Organic Molecules Hybrids, The Journal of Physical Chemistry Letters, 2019, pp. 1139-1145, 10.
Sun, et al., The first decade of Organic Spintronics research, Chemical Communications, pp. 1-13.
Tokunaga, et al., Electric-field-induced generation and reversal of ferromagnetic moment in ferrites, Nature Physics, Nov. 2012, pp. 838-844, vol. 8.
Xie, et al., Spin Specific Electron Conduction through DNA Oligomers, Nano Letters, 2011, pp. 4652-4655, 11.
Zwang, et al., Helix-Dependent Spin Filtering through the DNA Duplex, Journal of the American Chemical Society, 2016, pp. 15551-15554, 138.

\* cited by examiner

Fig. 2A
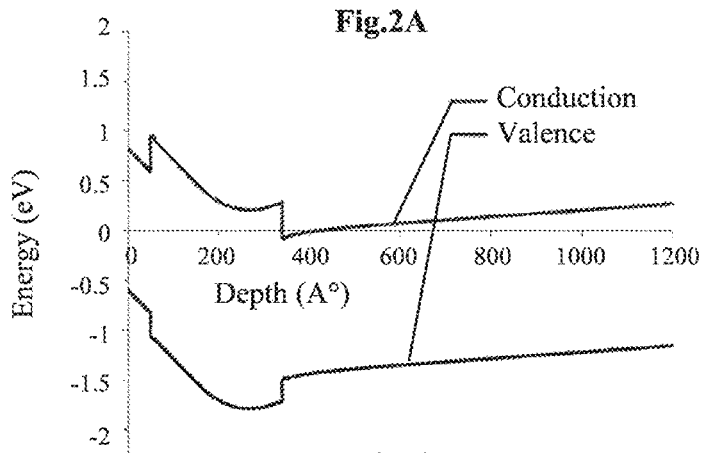
Fig. 2B
Fig. 2C
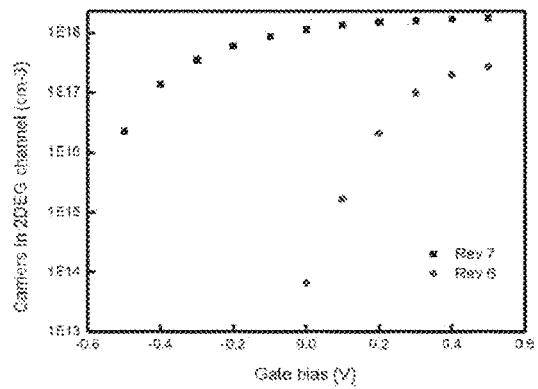
Fig. 2D

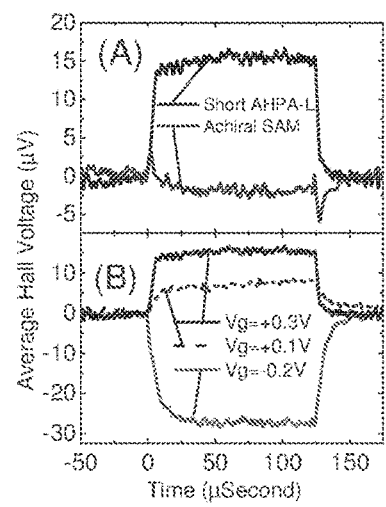
Fig. 3A
Fig. 3B
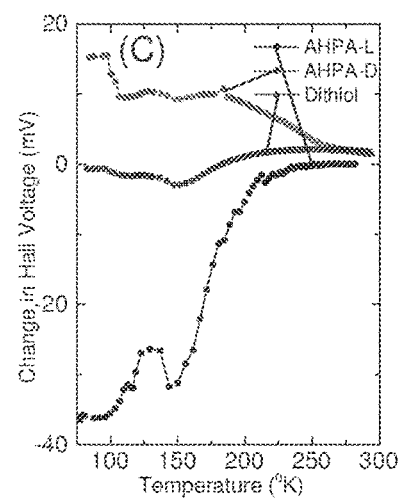
Fig. 3C

DEVICE FOR ELECTRIC FIELD INDUCED LOCAL MAGNETIZATION

TECHNOLOGICAL FIELD

The present invention relates to devices for electric-field induced local magnetization.

BACKGROUND ART

References considered to be relevant as background to the presently disclosed subject matter are listed below:
1. Matsukura, F., Tokura, Y. & Ohno. H. Control of magnetism by electric fields. *Nature Nanotechnology* 10, 209-220 (2015).
2. Heron. J. T. et al. Electric-Field-Induced Magnetization Reversal in a Ferromagnet-Multiferroic Heterostructure. *Phys. Rev. Lett.* 107, 217202 (2011).
3. Tokunaga, Y., Taguchi, Y., Arima, T. & Tokura, Y. Electric-field-induced generation and reversal of ferromagnetic moment in ferrites. *Nat. Phys.* 8, 838-844 (2012).
4. Ralph, D. C. & Stiles, M. D. Spin transfer torques. *J. Magn. Magn. Mater.* 320, 1190-1216 (2008).
5. Awschalom. D. & Samarth, N. Trend: Spintronics without magnetism. *Physics* 2, 50 (2009).
6. Kent, A. D. & Worledge, D. C. A new spin on magnetic memories. Nat. *Nanotech.* 10, 187 (2015).
7. Sun. D., Ehrenfreund. E. & Vardeny, Z. V. The first decade of organic spintronics research. *Chem. Commun.* 50, 1781 (2014).
8. Naaman, R. & Waldeck, D. H. Spintronics and Chirality: Spin Selectivity in Electron Transport through Chiral Molecules. *Ann. Rev. Phys. Chem.* 66, 263-81 (2015).
9. Michaeli, K., Varade, V., Naaman, R. & Waldeck. D. A new approach towards spintronics-spintronics with no magnets. *J. Phy: Condens. Matter* 29, 103002 (2017).
10. Zwang, T. J., Hlrlimann, S., Hill, M. G. & Barton, J. K. Helix-Dependent Spin Filtering through the DNA Duplex. *J. Am. Chem. Soc.* 138, 15551-15554 (2016).
11. Rosenberg, R. A., Mishra, D. & Naaman, R. Chiral Selective Chemistry Induced by Natural Selection of Spin-Polarized Electrons. *Angew. Chem. Int. Ed.* 54, 7295-7298 (2015).
12. Xie. Z. et al. Spin Specific Electron Conduction through DNA Oligomers. *Nano Lett.* 11, 4652-4655 (2011).
13. Kettner, M., Bhowmick, D. K., M. Bartsch. M., Gahler. B. & Zacharias, H. A Silicon-Based Room Temperature Spin Source without Magnetic Layers. *Adv. Mater. Interfaces,* 3, 1600595 (2016).
14. Kettner, M. B. et al. Spin Filtering in Electron Transport Through Chiral Oligopeptides. *J. Phys. Chem. C,* 119, 14542-14547 (2015).
15. Ben-Dor, O. B., Yochelis, S., Mathew, S. P., Naaman, R. & Paltiel, Y. A chiral-based magnetic memory device without a permanent magnet. *Nat. Commun.* 4, 2256 (2013).
16. Mathew. S. P., Mondal, P. C., Moshe, H., Mastai, Y. & Naaman, R. Non-magnetic organic/inorganic spin injector at room temperature. *Appl. Phys. Lett.* 105, 242408 (2014).
17. Koplovitz. G. et al. Magnetic Nanoplatelet-Based Spin Memory Device Operating at Ambient Temperatures. *Adv. Mater.* 29, 17, 1606748 (2017).
18. Ben Dor, O. et al. Magnetization switching in ferromagnets by adsorbed chiral molecules without current or external magnetic field. *Nat. Commun.* 8, 14567 (2017).
19. Dietl, T. A ten-year perspective on dilute magnetic semiconductors and oxides. *Nat. Mater.* 9, 972 (2010).
20. Ben Dor, O., Morali, N., Yochelis, S., Baczewski§, L. T. & Paltiel, Y. Local Light-Induced Magnetization Using Nanodots and Chiral Molecules. Nano Lett. 14(11), 6042-6049 (2014).

Acknowledgement of the above references herein is not to be inferred as meaning that these are in any way relevant to the patentability of the presently disclosed subject matter.

BACKGROUND

The local manipulation of magnetism through electric fields is valued for its technological application in memory devices as well as spintronics [1]. Most of its current realizations rely on ferromagnetic layers, and the electric fields merely adjust the spin orientation [2, 3]. Control of magnetic memory devices is primarily based on spin-selective transport phenomena, e.g., giant magnetoresistance. It is typically realized with magnetic materials, [4] however, alternative implementations that rely on large spin-orbit coupling have been proposed for spintronic applications [5]. So far, the major role of electric fields, in such magnetic devices, is to switch the direction of the moments [1-3, 6]. It has been shown that giant magnetoresistance devices can be made also by integrating organic molecules [7]. This takes advantage of the large spin-coherence length characteristic for many organic materials, which allows them to serve as buffers between magnetic components. The observation of chiral-induced spin-selectivity (CISS) [8], a large spin-polarization that arises when electrons transfer through chiral organic molecules, suggests the use of chiral molecules in place of magnetic elements [9]. Numerous different chiral organic molecules are known to act as spin filters at room temperature. A particularly strong CISS effect has been observed in nucleic acids [10-12] and peptides [13, 14] over a wide range of applied voltages. The preferred spin direction in CISS is determined by the handedness of the molecule and by the direction of the charge transfer.

It has been demonstrated that CISS allows both writing and reading-out of a magnet's orientation by driving current through a layer of chiral molecules [15-17]. In fact, alignment of magnetic domains has been achieved solely by the adsorption of organic molecules on top of a ferromagnet [18]. Here, the chemical potential mismatch between the two components leads to the injection of electrons or holes, which are spin-polarized due to CISS.

GENERAL DESCRIPTION

The invention relates to a technique for inducing local electric field controlled magnetization despite the absence of magnetic components. To this end, there is provided a novel heterostructure comprising a semiconductor substrate carrying a plurality of layers forming at least one heterojunction and hosting a two-dimensional electron gas layer when one of the layers of the plurality of layers is bounded to an interacting layer being a chiral or a biological macromolecule assembly. The term "heterostructure" generally refers to a structure having at least one heterojunction. The bonding between the heterojunction and the interacting layer may be performed by coating, chemically or electrostatically bounding, or by physical adsorption.

According to a broad aspect of the present invention, there is provided a heterostructure comprising a semiconductor substrate carrying a plurality of layers, wherein the plurality of layers comprises a first active layer having a first type of semiconducting material, a second active layer on the first active layer, the second active layer having a second type of semiconducting material; a two-dimensional electron gas layer located at the interface between the first and the second active layers; an interacting layer being a chiral layer or a biological macromolecule assembly bounded to at least a part of the second active layer. A chiral/biological layer is bounded to at least a part of the second active layer. The chiral/biological layer is bound either by covalent bond or by other way of attachment (e.g. electrostatic etc.) to a surface of the two-dimensional electron gas layer or physically adsorbed on it. The semiconductor layers form a heterojunction exhibiting electric-field induced ferro- or superpara-magnetism. In some embodiments, the plurality of semiconductor layers are non-magnetic or non-ferromagnetic. Despite the absence of any magnetic components or ferromagnetic components, clear signatures of robust ferro- or superpara-magnetism are observed, which is induced in these devices by applying a gate voltage at room temperature. In some embodiments, there is provided a semiconductor device comprising the heterostructure as defined above comprising a gate electrode electrically connected to the second active layer and placed at least partially on a top surface of the second active layer for injecting carriers into the two-dimensional electron gas from the interacting layer. Application of voltage on the gate electrode provides an electric field controlled magnetization of the heterostructure. It should be understood that the structure/semiconductor device of the present invention does not contain any magnetic/ferromagnetic components. A robust magnetic moment is induced by applying a gate voltage on chiral/biological molecules bounded to the heterostructure.

This phenomenon is a consequence of the spin-polarized charges injected to the semiconductor from the chiral/biological molecules. The orientation of the magnetic moment can be manipulated by low gate voltages, with a switching rate that is only limited by the charging time of the gate-semiconductor capacitor like structure and it has been demonstrated already to operate in the MHz range. Thus, the structure and the semiconductor device of the present invention implements an efficient, electric field controlled magnetization, which has long been desired for its technical prospects. The device of the present invention allows creation of localized magnetic fields on a sub-micron scale at room temperature solely by applying a small gate voltage (e.g. ~0.1V). From the measured Hall response, these magnetic fields are in the order of 100 Oe. Furthermore, the response time of the induced magnetization is very fast and could exceed 1 MHz without special optimization.

The appearance of a voltage-induced magnetic moment is confirmed by three independent experiments: microwave absorption, Hall Effect, and magnetization measurements using a superconducting quantum interference device. In some embodiments, the chiral layer comprises at least one of organic or inorganic matter having chiral properties. Chiral induced spin selectivity spin-polarizes the electrons that are transferred to the device through the organic molecules in response to the applied gate voltage. Even without extensive optimization, a magnetic field switching frequency of the order of 1 MHz at room temperature was obtained. This new scheme for room-temperature electric-field tuned magnetism also eliminates the need for complicated layered structures in spintronic devices.

The structure may be implemented to form magnetic-field-free memory or spintronic devices such as spin transistor. For example, this configuration may be used to form an active device to enhance memory arrays, or to form a 2D hall sensor for magnetic imaging as will be detailed further below. For example, there is provided a non-volatile, static magnetic semiconductor memory device. The memory device may comprise inter alia a semiconductor substrate of one conductivity type carrying two active layers confining a two-dimensional electron gas layer in between, a pair of spaced-apart regions of opposite conductivity type formed in the substrate. The spaced-apart regions define a channel therebetween, a chiral layer bounded on top of at least a part of the surface of the top semiconductor layer. A ferromagnetic layer is deposited at least partially at the bottom of the semiconductor substrate. Two electrodes may be electrically connected to the ferromagnetic layer and deposited at least partially on top of it. Data stored in the magnetic memory device is read by a voltage across the two electrodes. In a specific and non-limiting example, the memory device may comprise inter alia a gate electrode for producing an inversion layer across the channel whenever a predetermined voltage is applied to the gate member, a current sourcing means for flowing a current across the inversion layer from one of the spaced-apart regions to the other, a pair of base regions of the opposite conductivity type forming a junction in the substrate on opposite sides of the channel such that each of the base regions make Ohmic connection to the inversion layer, a pair of emitter regions of the one conductivity type, each of which forms a junction with one of the base regions, and a magnetic patch formed above the gate electrode for storing information in a magnetic field, whose flux lines are substantially transverse to the current. The magnetic field produces a Hall voltage in the inversion layer that is sensed by the base regions.

More specifically, the structure may be implemented as an active turbo magnetic chip being flip-chipped to standard magnetic memory arrays and enhancing the memory operational frequency and power consumption. Magnetization is achieved using the gated chiral-induced spin-selectivity (CISS) scheme as detailed below without current with applying voltage only. The frequency of operation can reach GHz.

Additionally or alternatively, the structure may be implemented as a 2D Hall sensor with enhanced sensitivity for magnetic imaging. This sensor may be used for both medical applications and homeland security applications. The gated CISS enables high frequency operation enabling fast images processing. Placing both directions of magnetic field with AC locking techniques reduces noise and offset, enhancing sensitivity dramatically.

Additionally or alternatively, the structure may be implemented as a nanoscale engineered system including the integration of a molecular motor with a nano-electro-mechanical system (NEMS). For example, such NEMS may be used as nanomotors for drug targeting creating an AC magnetic field, which can rotate or move a small motor based on a nanoparticle/nanoparticles/molecules. Such motors can be used for specific targeting within cells to certain markers such as attraction to magnetic nanomarkers.

In some embodiments, the semiconductor substrate is formed by at least one of GaAs, GaN or silicon material. The plurality of semiconductor layers may comprise at least one of GaAs, AlGaAs, n-doped AlGaAs, p-doped AGaAs. GaN, AlGaN, n-doped AlGaN or p-doped AlGaN. In a specific and non-limiting example, the heterostructure may be formed by GaAs/AlGaAs or GaN/AlGaN heterostructures-chiral organic molecules hybrids. A GaAs/AlGaAs heterojunction hosts a two-dimensional electron gas and is coated with a monolayer of chiral organic molecules. In some embodiments, the chiral layer comprises a self-assembled monolayer of the chiral molecules. For example, GaAs/ AGaAs heterojunctions coated with self-assembled monolayers of chiral molecules exhibit electric-field induced ferro- or superpara-magnetism.

In some embodiments, the semiconductor device further comprises a ferromagnetic layer deposited at least partially at the bottom of the heterostructure or below the first active layer. The ferromagnetic layer may be configured for being magnetized by the electric field controlled magnetization of the heterostructure.

In some embodiments, the semiconductor device further comprises at least two electrodes connected to the ferromagnetic layer, wherein at least one of the two electrodes is made of a ferromagnetic material defining a main surface and being magnetized in a direction perpendicular to the main surface.

In some embodiments, the interacting layer comprises a conductive substrate deposited at least partially at a top surface of the heterostructure configured to create a Hall potential. For example, the conductive layer may be a gold layer having a thickness up to 15 nm.

In some embodiments, the conductive substrate is configured for carrying biological macromolecules being configured to induce a change in the Hall potential. The biological macromolecules assembly may comprise at least one of enzymes carried by a substrate. DNA molecules. RNA molecules, proteins or peptides.

In some embodiments, the semiconductor device is configured as a memory array comprising a plurality of memory cells formed on the substrate being configured for transferring spin data to electrons passing the two-dimensional electron gas layer, wherein data stored in the magnetic memory cell are read by a voltage across the at least two electrodes.

In some embodiments, there is provided an array of semiconductor devices comprising a plurality of semiconductor devices as defined above, wherein each semiconductor device is addressable individually and is readable by a current flowing through the ferromagnetic layer. The plurality of semiconductor devices may be connected to each other and arranged in a spaced-apart configuration, such that each semiconductor device is magnetizeable by the electric field controlled magnetization of the heterostructure, such that the array is magnetizeable in sequence. The plurality of semiconductor devices may be configured for rotating a magnetic motor. The array of semiconductor devices may be configured for identifying or screening molecules and the interaction between them.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 2A shows examples of a wafer composition profile;

FIG. 2B shows calculated energy levels for the structure illustrated in FIG. 1B;

FIG. 2C shows a possible composition profile for the structure;

FIG. 2D shows the carrier's concentration of the two-dimensional electron gas (2DEG) as a function of gate bias for the structure illustrated in FIG. 1B;

FIGS. 3A-3C show hall voltage measurements in the absence of an external magnetic field as a function of time in response to three different values of gate voltages;

DETAILED DESCRIPTION OF EMBODIMENTS

Figure 1A:
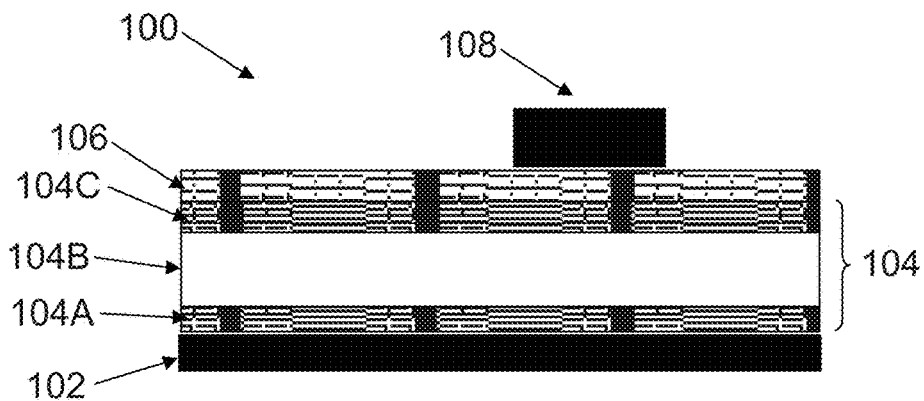
FIG. 1A schematically illustrates possible layers of the novel structure of the present invention.

Reference is made to FIG. 1A schematically illustrating different possible layers of the novel structure/device of the present invention. The heterostructure 100 of the present invention comprises a semiconductor substrate 102 carrying a plurality of layers comprising a semiconductor substructure 104 comprising first and second active layers 104A and 104C confining a two-dimensional electron gas layer 104B in between and a chiral/biological layer 106 bounded on top of at least a part of the surface of the top semiconductor layer 104C. In other words, the two-dimensional electron gas layer 104C is covered by at least one semiconductor layer 104C on top of which a chiral/biological layer 106 is bounded on at least a part of the surface of the top semiconductor layer 104C. The chiral/biological layer 106 is bound to a surface of the two-dimensional electron gas layer or physically adsorbed on it. If the chiral layer/biological 106 (e.g. either organic or inorganic) is coated with a gate electrode 108, the heterostructure 100 forms a semiconductor device exhibiting electric-field induced ferro- or superpara-magnetism. In this connection, it should be noted that, although in the figure, for sake of simplicity, the top surface of each layer is entirely covered by another layer, the invention is not limited at all to this illustration. Only a part of each layer may be covered by another partial or entire layer. For example, the chiral/biological layer may partially cover a region of the top semiconductor layer as will be illustrated for example in FIG. 7C below.

Figure 1B:
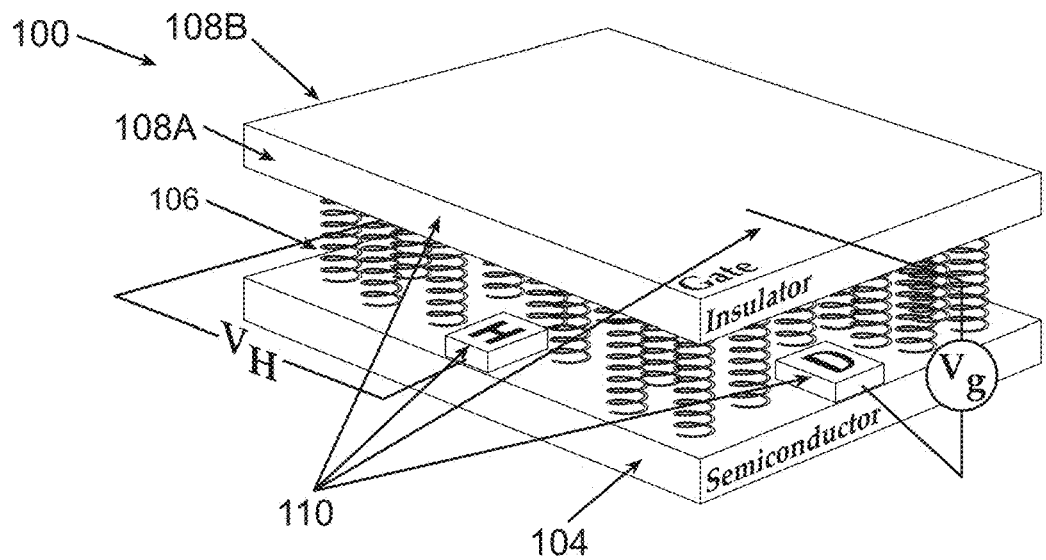
FIGS. 1B-1C illustrate a schematics diagram of possible configurations of the novel structure of the present invention.

Reference is made to FIG. 1B schematically illustrating a semiconductor-chiral molecules hybrid device including the novel structure of the present invention. In this specific and non-limiting example, the device 100 comprises a semiconductor substrate carrying a plurality of layers including a semiconductor substructure 104 having GaAs/AlGaAs layers hosting a shallow two-dimensional electron gas (2DEG), with a layer of organic chiral molecules 106 adsorbed on the top surface of the semiconductor substructure 104. The inventors implemented four kinds of structures that differ by the type of organic molecules. In this specific and non-limiting example, each structure contained either only left- or only right-handed molecules of $[SH]-C-(A-A-A-A-K)_7-$

[COOH] (denoted by long AHPA-L and AHPA-D) or SHCH2CH2CO-(Ala-Aib)$_5$-COOH (denoted by short AHPA-L and short AHPA-D).

In the configuration illustrated in FIG. 1B, the chiral molecules 106 are covered with an insulator 108A (e.g. 30 nm thick MgO layer) on top of which a gate electrode 108B (e.g. made from gold) is deposited. The semiconductor substructure 104 was patterned with four contacts 110, source (S), drain (D) and two transverse electrodes (H), to allow for Hall measurements. This configuration may be used for injecting carriers into the two-dimensional electron gas from the chiral layer, such that application of voltage on the gate electrode provides an electric field controlled magnetization of the heterostructure. In this way, the novel structure of the present invention may be implemented as a Hall effect sensor being configured for measuring the magnitude of a magnetic field. The output voltage of the Hall effect sensor is directly proportional to the magnetic field strength through it.

Figure 1C:
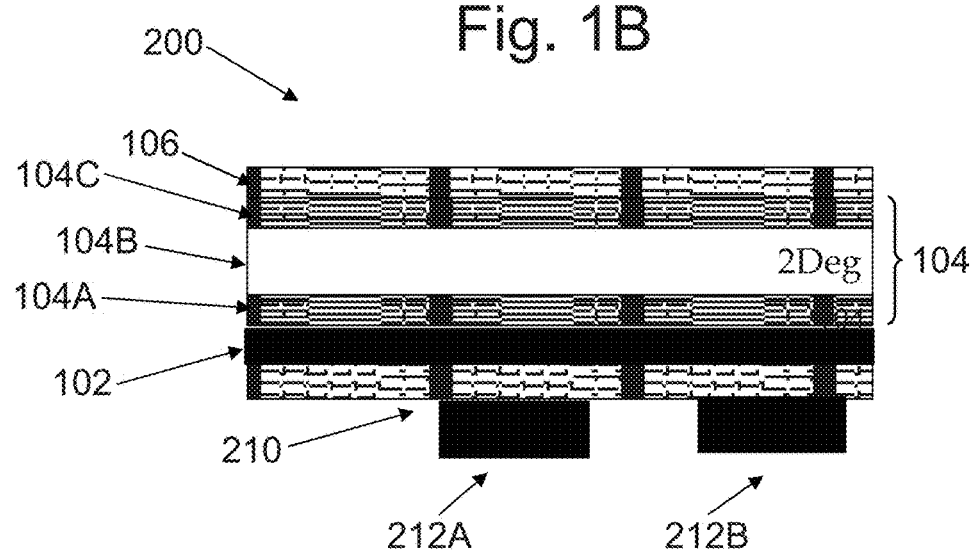

Reference is made to FIG. 1C schematically illustrating different possible layers of a possible configuration of the novel device of the present invention. In this embodiment, the device is configured as a memory array comprising a plurality of memory cells formed on the semiconductor substrate 102. In the figure, one memory cell 200 is illustrated being configured for transferring spin data to electrons passing the two-dimensional electron gas layer 104B. Memory cell 200 may be magnetizable by inducing an electric field controlled magnetization of the heterostructure. Semiconductor substrate 102 carries first and second active layers 104A and 104C confining a two-dimensional electron gas layer 104B in between, and a chiral layer 106 bounded on top of the surface of the top semiconductor layer 104C. A ferromagnetic layer 210 is deposited at the bottom of the semiconductor substrate 102 heterostructure or below the semiconductor layer that defines the 2DEG. Two electrodes 212A and 212B electrically connected to ferromagnetic layer 210 are deposited at least partially on top of it. The ferromagnetic layer 210 is configured for being magnetized by the electric field controlled magnetization of the heterostructure. In some embodiments, one of the two electrodes (212A or 212B) is made of a ferromagnetic material defining a main surface and being magnetized in a direction perpendicular to the main surface. For example, two ferromagnetic contacts of harder magnetic material may be deposited at two opposite corners of the ferromagnetic layer to measure the magnetization of the layer. Data stored in the magnetic memory cell 200 are read by a voltage across electrodes 212A and 212B. Although not specifically shown, ferromagnetic layer 210 may also be placed at least partially below the bottom surface of the first active layer 104A (at the interface between the semiconductor substrate 102 and the first active layer 104A).

Memory cells 200 may be arranged in a spaced-apart configuration such that the spaced-apart cells are magnetizable in sequence. Such plurality of spaced-apart cells may be configured for rotating a magnetic motor. For example, the motor controller function may be operated by implementing program steps representing the input command and output control logic stored in a plurality of programmable, non-volatile spaced-apart memory cells. The memory cells provide the storage of information such as digital sequences, in a number of separate areas, wherein each area may be designated by address.

EXAMPLES

Various examples were carried out to prove the embodiments claimed in the present invention. Some of these experiments are referred to hereinafter. The examples describe possible implementations of the present invention but are not to be construed as limiting the invention. In specific and non-limiting examples, the composition profile and the energy levels of the heterostructures used for the gated device illustrated for example in FIG. 1B may be as given in FIGS. 2A-B. However, it should be noted that the invention is not limited to any specific composition profile. The semiconductor substrate may be formed by GaAs, GaN or silicon material. The plurality of semiconductor layers may comprise GaAs and/or AlGaAs and/or n-doped AlGaAs and/or p-doped AlGaAs and/or GaN and/or AlGaN and/or n-doped AlGaN and/or p-doped AlGaN. Heterostructures with different characteristics may also be used for the ungated devices. An example of a composition profile of the wafers carrying the ungated devices is shown in FIG. 2C. In addition, a comparison between the densities of the two kind of substrates is presented in FIG. 2D.

More specifically, FIG. 2A shows an example of a GaAs two-dimensional electron gas (2DEG) wafer composition profile and FIG. 2B shows calculated energy levels for the device illustrated in FIG. 1B. In this specific and non-limiting example, the 2DEG emerges 36 nm below the surface, at the GaAs—AlGaAs interface. FIG. 2C shows a possible composition profile. In this specific and non-limiting example, the 2DEG emerges 58 nm below the surface, at the GaAs—AlGaAs interface. FIG. 2D shows the carrier's concentration of the 2DEG of the structure illustrated in FIG. 1B as function of gate bias. The device of FIG. 1B displays higher conductivity and retains some functionality at negative gate voltage.

In a specific and non-limiting example, in devices of the type configuration of FIG. 1B, Ohmic contacts were deposited onto the 2DEG gas wafers by removing the oxides from the wafer using 16% HCL for 30 seconds. After a period of time that does not exceed 5 minutes, the samples were moved into high vacuum and a layer of 5 nm Ni—60 nm Au—30 nm N-doped Ge—20 nm Ni—100 nm Au was deposited on them (e-beam deposition). Following the metal deposition, the samples were annealed for 120 seconds in $N_2$ environment at temperature of 380° C. using a RTP oven. Several measurements were performed on these devices as follows: for SQUID measurements, Ti was used instead of nickel. Hall and microwave absorption experiments were performed on devices with a long and thin channel (e.g. 40×480 μm channel), while the SQUID measurements were done on a square design (e.g. 200×200 μm) with twice the surface area.

In a specific and non-limiting example, the chiral layer comprises a self-assembled monolayer of the chiral molecules. More specifically, the solution used for the formation of the chiral self-assembled monolayer (SAM) was super saturated SHCH2CH2CO-{Ala-Aib}5-COOH (Hy Labs, Israel) in anhydrous toluene. For the achiral SAM 2 mMol of 3-Mercaptopropionic acid (Sigma-Aldrich) was used in anhydrous toluene. The SAM formed with the chiral monolayer has a thickness of 2 nm as measured by an ellipsometer. The density of the molecules was about $\sim 2\times 10^2$ molecules per mm$^2$. Following the formation of the SAM, 15 nm of MgO were deposited by e-beam on top of the samples, at rate of 0.1 A/sec for the first 3 nm and 0.2 A/see for the rest. A gate consisting of another 15 nm of MgO, 10 nm Ti (0.5 A/sec) and 130 nm Au (2 A/sec) was then deposited by e-beam.

Upon applying a positive (negative) gate voltage, a short pulse of charge-current flows through the molecule to the semiconductor. As a consequence of the chiral-induced spin-selectivity (CISS) effect, this current should be spin-polarized. The injected electrons or holes can enter either the conduction band or valence band, respectively, or become trapped in impurity states. In either scenario, the charges in the heterostructure carry a non-zero spin-magnetization at times shorter than the spin-relaxation time, which can be as long as a few hundreds of nanoseconds.

FIGS. 3A-3C show hall voltage measurements in the absence of an external magnetic field. The average Hall potential of a short AHPA-L device as a function of time in response to three different values of gate voltages is plotted in the panel (FIG. 3A). The source drain current was 10 µAmp in all measurements. The gate voltage is switched on at t=0 and off at t=125 µsec. The Hall response, which depends on the sign of the gate voltage, remains constant as long as voltage is applied. For comparison, a device with achiral molecules (3-Mercaptopropionic acid) does not show any Hall effect (FIG. 3B). In the long AHPA-L or D devices, a Hall response develops below 200K even without an applied gate voltage (FIG. 3C). In contrast, no Hall signal is measured in devices with achiral molecules (dithiol).

In the first set of experiments, a Hall circuit was patterned on GaAs/AlGaAs and had a monolayer of short AHPA-L adsorbed on top of the source-drain current channel. The data in FIGS. 3A-3C show that a Hall voltage is generated when an electric potential is applied between the monolayer and the 2DEG layer, even though no external magnetic field is applied (see FIG. 1B). The Hall signal displays fast rise (about 1 sec) and remains constant as long as the gate voltage is applied. Once the voltage is turned off, the Hall signal decays within 1 µsec. It should be noted that the sign of the Hall response depends on the sign of the applied voltage (FIG. 3C). This observation agrees with the known property of the spin-filtering due to the CISS effect which depends on the current direction. In contrast, any Hall response was not observed when the adsorbed molecules were achiral (see FIGS. 3A and 3B). Interestingly, when long AHPA-L or D molecules are used, a permanent Hall response is measured at temperatures below 200K, even in the absence of an applied gate voltage (see FIG. 3A). An opposite sign of the Hall signal is observed for the left- and right-handed molecules. The magnitude of the Hall response, however, is unequal for the two types of molecules. This can be due to the lower purity of the D enantiomer that forms a less packed monolayer. As a control experiment, the Hall effect measurement was repeated on the bare semiconductor. To obtain a similar signal to the signal achieved in the presence of the chiral molecules without magnetic field at room temperature and 0.3V, an external magnetic field of the order of 100 Oe was applied.

Figure 4:
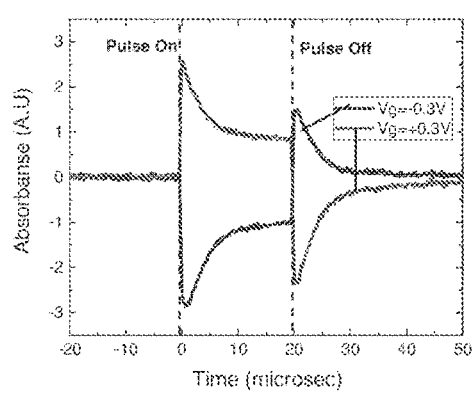
FIG. 4 shows a microwave absorbance as a function of time for two opposite gate voltages (±0.3V)

FIG. 4 shows microwave absorbance as a function of time for two opposite gate voltages (±0.3V). The voltages were applied for 20 µsec, and a microwave absorption signal with a rise time of 10 µsec was measured. The only substantial difference between a positive and a negative gate voltage is a n-phase shift in the signal. In both cases, a n-phase change also occurs when the voltage is turned off.

To examine the induced magnetism, microwave (9.5 GHz) absorptions by the AHPA-L device were measured when it was placed inside an EPR cavity and no current flowed between source and drain. A microwave signal was observed following the application of a gate voltage. Similar to the Hall response, the signal persisted as long as the gate potential was applied, and quickly decayed after the potential was switched off, as shown in FIG. 4. The sign of the voltage manifests itself in the phase of the microwave absorption signal. The difference between a positive and a negative gate voltage is a n-phase shift in the signal. An additional x-phase change was observed, in both samples, when the voltages were switched off. The microwave absorption of 9.5 GHz corresponds to an energy splitting of around 10 µeV in the spin states of the device. The phase of the microwave signal relates to absorption-emission for the positive and negative phase respectively. Due to the low Q factor of the cavity, the microwave absorption is very broad, exceeding 1 GHz.

Figure 5A:
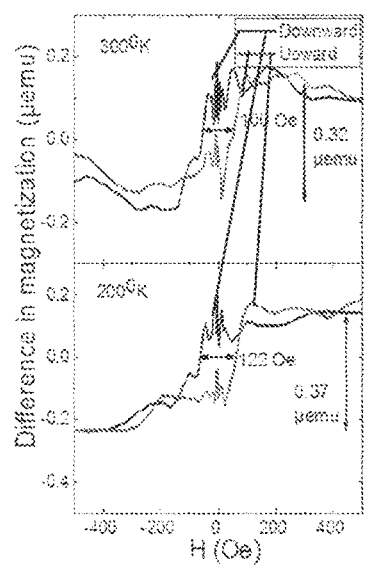
FIGS. 5A-5B show magnetic moment measurements using a SQUID as a function of an external magnetic field.
Figure 5B:
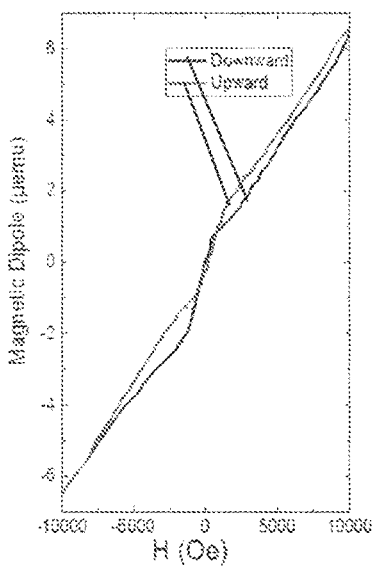

FIG. 5 shows magnetic moment measurements using a SQUID as a function of an external magnetic field. In FIG. 5A the magnetization of a short AHPA-L is measured in the presence of an applied gate voltage of −0.6V at 300K and 200K (presented with respect to the value at V=0). A clear hysteresis is shown in both cases. In FIG. 5B the magnetization of a long AHPA-L device is measured in the absence of an applied gate at 200K (presented with respect to the value at T=300K). The error in all measurements is about 0.02 µemu. A third experiment was performed to directly measure the magnetization with a superconducting quantum interference device (SQUID). The magnetization of the short AHPA-L molecules-semiconductor hybrid is shown in FIG. 5A. A clear hysteresis behavior was observed with a cohesive field of about 100 Oe at 300K that grows as the temperature decreases. It should be noted that the data (obtained at −0.6V) are presented after subtracting the background magnetization measured with zero gate voltage. In the long AHPA-L devices, a magnetic moment was measured once the devices were cooled below 200K, as illustrated in FIG. 5B. In contrast, no signature of magnetization was observed for achiral molecules. The SQUID measurements, thus, confirm the electric-field induced ferro- or superpara-magnetism. The magnetic moment measured in the first device illustrated in FIG. 1B at saturation, corresponds to about $10^{13}$ spins, which is consistent with a density of about $10^{14}$ spins/cm$^2$. For comparison, the densities of the molecules absorbed on the surface, as well as the 2DEG, are both smaller by two orders of magnitude. Former studies indicate that each adsorbed molecule injects at most one electron into the semiconductor. Indeed saturation was observed in all signals above a certain voltage of about ±0.5 V. Thus, the large moment measured by the SQUID implies that additional spins are contributing to the magnetization. This phenomenon resembles the observation of magnetism in meteorites that is much larger than the concentration of magnetic atoms would suggest. There it was proposed that carbon atoms inside the meteorites are magnetized by a proximity effect. A similar mechanism could also explain/ lead to the large magnetic moment found in the GaAs/ AlGaAs-chiral molecules hybrids device of the present invention.

Electrons or holes are injected into the heterostructure when the molecules are adsorbed to its surface because of an electro-chemical potential mismatch. Additional charge is transferred upon application of a gate voltage, or a change of temperature. In all cases, charge carriers may either join the 2DEG, or occupy impurity states. With regard to the former, ferromagnetism has been predicted (but not seen) to arise in electron gases at ultralow densities. In any cases, increasing the density of the 2DEG cannot induce the observed ferromagnetism, and the second scenario is more plausible. The impurity states may either be localized or form a narrow band; either way these electrons are much less mobile than the ones in the 2DEG, and more susceptible to interaction effects. Firstly, the larger mass could conceivably place the impurity band in the regime of low-density ferromagnetism. Yet, the observation that increasing the density of these electrons via a gate voltage strengthens magnetism, rules out this possibility. An alternative route is that the mobile 2DEG electrons mediate the exchange interaction between impurity electrons. It is known that such an interaction, as RKKY mechanism [19], gives rise to ferromagnetism in three-dimensional magnetically doped semiconductors. While RKKY is usually invoked in the context of localized magnetic impurities, it should equally well apply for mobile ones, so long as their effective mass is much larger than that of the mediating carriers. The sign of the RKKY interaction oscillates with the distance r between the 2DEG and the electron located in the impurity state, as $-\sin(\sqrt{8\pi n}r)/r^2$, where n is the carrier density of the 2DEG. In the device of the present invention, the densities of injected electrons and 2DEG are comparable, and the RKKY interaction is always ferromagnetic. It should be noted that within this scenario, increasing the voltage should strengthen the magnetization, as observed.

To investigate further the origin of the ferromagnetic phase, the relation between the longitudinal ($R_{xx}$) and transverse ($R_H$) resistance of the long AHPA devices for which spontaneous magnetization is observed, was below 200K. The Hall voltage measured in the absence of an external magnetic field is plotted in FIG. 6A as a function of $R_{xx}$. A clear linear dependence was found at low resistance. Since the magnetization is roughly constant in this regime, the Hall resistance scales with the longitudinal resistance as $R_H = (R_0 + \alpha R_{xx})M$, where M is the magnetization and $R_0$, a are constants. It should be noted that the two contributions to the resistance are of similar magnitude which suggests that a substantial part of the Hall effect is of the anomalous type. A similar anomalous Hall effect is known to occur in ferromagnetic semiconductors such as Mn-doped GaAs. These layers exhibit large spin-orbit coupling. The presence of an anomalous Hall effect implies sizeable exchange couplings between the itinerant electrons and the localized spins and supports the picture of ferromagnetic interaction mediated by 2DEG.

Figures 6A, 6B:
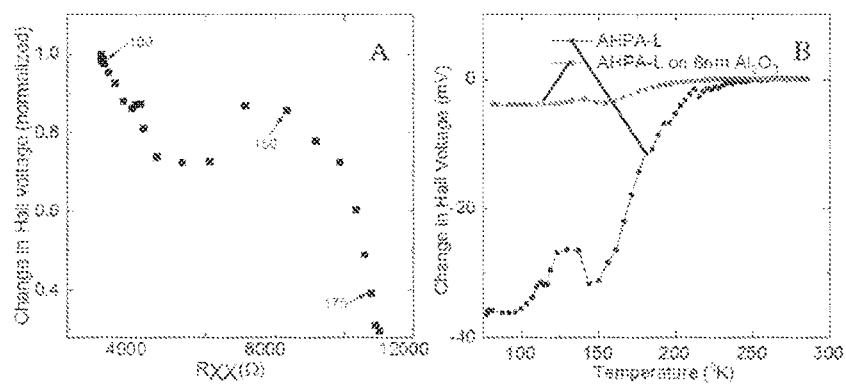
FIG. 6A shows the Hall resistance of a long AHPA-L device as a function of the longitudinal resistance.
FIG. 6B shows the change in the Hall voltage as a function of temperature for the same device as in FIG. 6A and the change in the Hall potential in a similar device in which the molecules are adsorbed on top of 6 nm of $Al_2O_3$ layer.

FIG. 6A shows the Hall resistance of a long AHPA-L device as a function of the longitudinal resistance. Both resistances were measured below 200K. In the range that R, is between 6500 and 4500Ω, the Hall potential follows a clear linear dependence. FIG. 6B shows the change in the Hall voltage as a function of temperature for the same device as in FIG. 6A and the change in the Hall potential in a similar device in which the molecules are adsorbed on top of 6 nm of $Al_2O_3$ layer. The addition of the insulating alumina layer quenches the Hall signal.

Finally, an additional indication that the 2DEG is essential for the magnetization, is found when 6 nm of $Al_2O_3$ tunnel barrier was added between the semiconductor surface and the chiral molecules. As shown in FIG. 6B, the Hall Effect disappears at all temperatures upon adding the tunnel barrier to the long AHPA device. These experimental indications of significant exchange coupling between the conduction electrons and the impurity band that hosts the injected electrons implies that the latter resides far from the surface and close to the 2DEG. Thus, the charges injected from the molecules maintain their spin over a distance of a few hundreds of angstroms. Such a long and fast spin injection is frequently seen in GaAs. A significant hybridization between the molecules and the impurity band is thus observed.

Figure 7A:
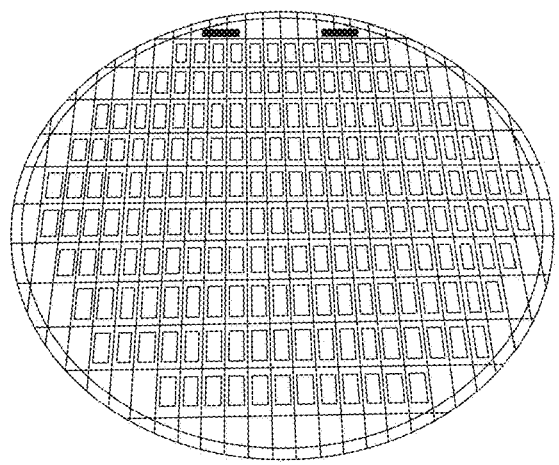
FIGS. 7A-7C are different illustrations of a possible implementation of the device being configured for measuring enzymatic activity according to some embodiments of the present invention.
Figure 7B:
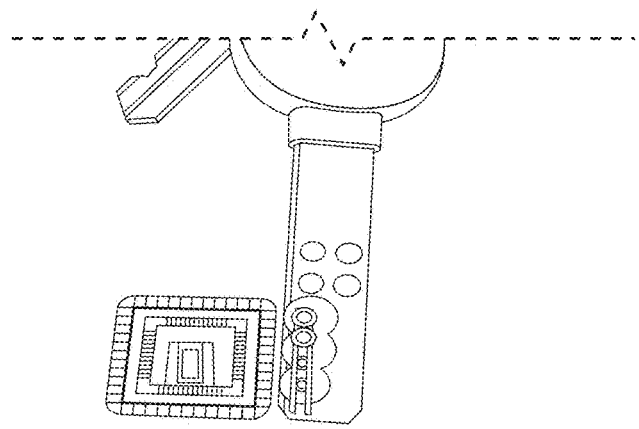
Figure 7C:
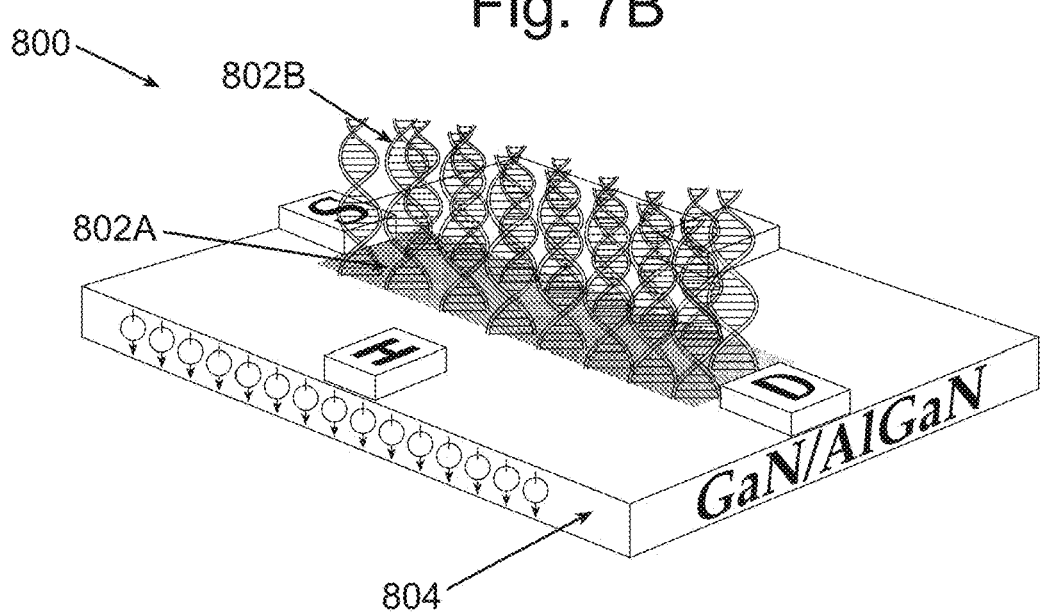
Figure 8A:
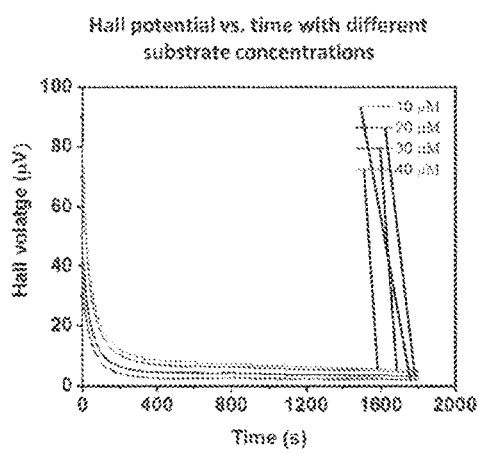
FIGS. 8A-8B are measurements of Hall potential as a function of time with different substrate concentrations using the device illustrated in FIGS. 7A-7C.
Figure 8B:
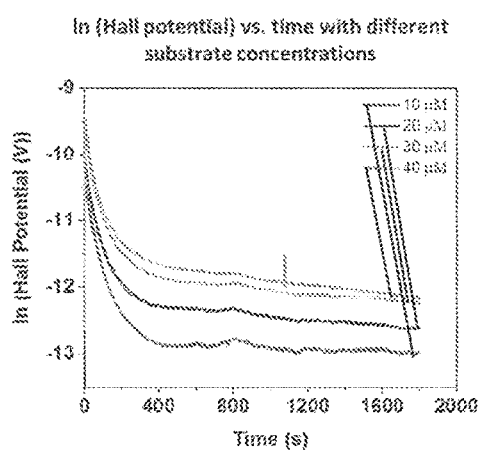

Reference is made to FIGS. 7A-7C illustrating a possible device being configured for measuring biological activity according to some embodiments of the present invention. For example, the device of the present invention can be used to monitor enzymatic activities as well as for monitoring interaction between DNA/RNA and proteins. FIG. 7A is a top overview of hundreds of integrated circuits (ICs or chip) produced in parallel. Each chip can be used separately, or a plurality of chips can be connected in series or parallel configurations. FIG. 7B illustrates a chip holder that can hold numerous devices and allow monitoring them in parallel. The integration of the device of the present invention in a plurality of spaced-apart integrated circuits used in parallel, enables fast and direct screening of a plurality of molecules of different types in parallel. FIG. 7C illustrates a possible structure configuration of an integrated circuit including a Hall effect sensor 800 (e.g. produced on either GaN/AlGaN or GaAs/AlGaAs structures) based on the teachings of the present invention. In this specific and non-limiting configuration, the sensor 800 comprises a semiconductor substrate carrying a plurality of layers including a semiconductor substructure 804 having GaN/AlGaN layers hosting a shallow two-dimensional electron gas (2DEG), with a layer of biological macromolecules adsorbed on the top surface of the semiconductor substructure 804. The conductive channel between the source (S) and the drain (D) of the sensor is directly coated (with no chiral molecules) with an interacting layer including a conductive substrate 802A carrying biological macromolecules 802B. Conductive substrate 802A is therefore deposited partially at the top surface of the heterostructure 804 and is configured to create a Hall potential. For example, the conductive substrate may be a thin gold layer having thickness up to 10 nm (e.g. about 15 nm). The biological macromolecules 802B are configured to induce a change in the Hall potential. The biological macromolecules 802B are bound to a surface of the conductive substrate 802A or physically attached (e.g. adsorbed) on it. The Hall effect sensor 800 may then be exposed to a solution into each the substrate of an enzyme or a group that can bind to the enzyme if injected. If a plurality of devices is used in parallel, different types of molecules may be identified or screened in this way, as well as the interaction between them. The kinetics of the interaction of the biological macromolecule (e.g. protein) with injected molecules may be monitored as a function of time as shown in FIGS. 8A-8B. FIGS. 8A-8B show measurement of Hall potential with respect to time using the substrate 2,2'-Azino-bis (3-ethylbenzthioazoline-6-sulfonic acid) diammonium salt (ABTS) with different concentrations. In the figures, the response of the device coated with lacasse when exposed to various concentrations of the substrate ABTS (2,2'-Azino-bis (3-ethylbenzthiazoline-6-sulfonic acid) diammonium salt) is shown. In FIG. 8A, the Hall potential is plotted as a function of time for four different concentrations (10 μm, 20 μm, 30 μm, 40 μm), and in FIG. 8B, the logarithm of the signal is plotted. The device requires only that current flows between the source and drain electrodes. Electrons or holes are supplied by the electrical contacts (i.e. source or drain electrodes) to the biological macromolecule assembly, and from there to the molecules in solution that interact with the biological macromolecule assembly. The electric potential is monitored via the Hall electrode (marked H in FIG. 7C) perpendicular to the direction of flow of the current between the source and drain electrodes. The process is driven by the difference in chemical potential between the molecules in the solution and the biological macromolecule assembly.

The invention claimed is:

1. A semiconductor device comprising a heterostructure comprising:
a semiconductor substrate carrying a plurality of layers, wherein said plurality of layers comprises:
a first active layer having a first type of semiconducting material;
a second active layer on said first active layer, said second active layer having a second type of semiconducting material;
a two-dimensional electron gas layer located at the interface between the first and the second active layers; and
an interacting layer being a chiral layer or a biological macromolecule assembly bounded to at least a part of said second active layer;
the device further comprising a gate electrode electrically connected to said second active layer and placed at least partially on a top surface of the second active layer for injecting carriers into the two-dimensional electron gas from the interacting layer, such that application of voltage on said gate electrode provides an electric field controlled magnetization of the heterostructure.

2. The semiconductor device of claim 1, further comprising a ferromagnetic layer deposited at least partially at a bottom surface of the heterostructure or below a bottom surface of said first active layer; wherein said ferromagnetic layer is configured for being magnetized by the electric field controlled magnetization of the hetero structure.

3. The semiconductor device of claim 2, further comprising at least two electrodes electrically connected to said ferromagnetic layer, wherein at least one of said two electrodes is made of a ferromagnetic material defining a main surface and being magnetized in a direction perpendicular to the main surface.

4. The semiconductor device of claim 3, being configured as a memory array comprising a plurality of memory cells formed on said substrate being configured for transferring spin data to electrons passing the two-dimensional electron gas layer, wherein data stored in the magnetic memory cell are read by a voltage across said at least two electrodes.

5. An array of semiconductor devices comprising a plurality of semiconductor devices as defined in claim 2, wherein each semiconductor device is addressable individually and is readable by a current flowing through said ferromagnetic layer.

6. The array of semiconductor devices of claim 5, wherein said plurality of semiconductor devices are electrically connected to each other and arranged in a spaced-apart configuration, such that each semiconductor device is magnetizeable and the array is magnetizeable in sequence.

7. The array of semiconductor devices of claim 6, wherein said plurality of semiconductor devices are configured for rotating a magnetic motor.

8. The array of semiconductor devices of claim 5, being configured for identifying or screening molecules and the interaction between them.

9. The semiconductor device of claim 1, wherein said interacting layer comprising a conductive substrate deposited at least partially at a top surface of the heterostructure configured to create a Hall potential.

10. The semiconductor device of claim 9, wherein said conductive substrate is configured for carrying biological macromolecules being configured to induce a change in the Hall potential.

11. The semiconductor device of claim 10, wherein said biological macromolecules assembly comprises at least one of enzymes molecules, DNA molecules, RNA molecules, proteins or peptides.

12. The semiconductor device of claim 1, wherein said chiral layer comprises at least one of organic or inorganic matter having chiral properties.

13. The semiconductor device of claim 1, wherein said semiconductor substrate is formed by at least one of GaAs or GaN or silicon material.

14. A semiconductor device comprising a heterostructure comprising:
a semiconductor substrate carrying a plurality of layers, wherein said plurality of layers comprises:
a first active layer having a first type of semiconducting material;
a second active layer on said first active layer, said second active layer having a second type of semiconducting material;
a two-dimensional electron gas layer located at the interface between the first and the second active layers; and
an interacting layer being a biological macromolecules assembly bounded to at least a part of said second active layer; wherein said interacting layer comprises a conductive substrate deposited at least partially at a top surface of the heterostructure configured to create a Hall potential; said conductive substrate being configured for carrying the biological macromolecules being configured to induce a change in the Hall potential;
the device further comprising a gate electrode electrically connected to said second active layer and placed at least partially on a top surface of the second layer for injecting carriers into the two-dimensional electron gas from the interacting layer, such that application of voltage on said gate electrode provides an electric field controlled magnetization of the heterostructure.

15. The semiconductor device of claim 14, further comprising a ferromagnetic layer deposited at least partially at a bottom surface of the heterostructure or below a bottom surface of said first active layer; wherein said ferromagnetic layer is configured for being magnetized by the electric field controlled magnetization of the hetero structure.

16. The semiconductor device of claim 15, further comprising at least two electrodes electrically connected to said ferromagnetic layer, wherein at least one of said two electrodes is made of a ferromagnetic material defining a main surface and being magnetized in a direction perpendicular to the main surface.

17. The semiconductor device of claim 16, being configured as a memory array comprising a plurality of magnetic memory cells formed on said substrate being configured for transferring spin data to electrons passing the two-dimensional electron gas layer, wherein data stored in the magnetic memory cell are read by a voltage across said at least two electrodes.

18. The semiconductor device of claim 14, wherein said plurality of layers are non-magnetic or non-ferromagnetic.

19. The semiconductor device of claim 14, wherein said semiconductor substrate is formed by at least one of GaAs or GaN or silicon material.

* * * * *